(12) United States Patent
Takekawa et al.

(10) Patent No.: US 8,871,408 B2
(45) Date of Patent: Oct. 28, 2014

(54) MASK PATTERN CREATION METHOD, RECORDING MEDIUM, AND SEMICONDUCTOR DEVICE MANUFACTURING METHOD

(75) Inventors: Yoko Takekawa, Tokyo (JP); Masafumi Asano, Kanagawa (JP); Yingkang Zhang, Kanagawa (JP); Kazuhiro Takahata, Kanagawa (JP); Tomoko Ojima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 13/604,076

(22) Filed: Sep. 5, 2012

(65) Prior Publication Data
US 2013/0224635 A1     Aug. 29, 2013

(30) Foreign Application Priority Data
Feb. 27, 2012 (JP) ................................. 2012-039788

(51) Int. Cl.
*G03F 1/68* (2012.01)
(52) U.S. Cl.
USPC ................................................ 430/5; 703/13

(58) Field of Classification Search
USPC .................................... 430/5, 30, 319; 703/13
See application file for complete search history.

(56) References Cited

U.S. PATENT DOCUMENTS

| 6,004,701 | A | 12/1999 | Uno et al. |
| 6,577,994 | B1 | 6/2003 | Tsukuda |
| 8,263,323 | B2 * | 9/2012 | Yoon et al. ................ 430/324 |

FOREIGN PATENT DOCUMENTS

| JP | 2001-014376 | 1/2001 |
| JP | 2003-015271 | 1/2003 |
| JP | 2004-046200 | 2/2004 |

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

According to one embodiment, a mask pattern creation method includes extracting an area, in which a DSA material is directed self-assembled to form a DSA pattern, from a design pattern area based on a design pattern and information on the DSA material. The method also includes creating a guide pattern that causes the DSA pattern to be formed in the area based on the design pattern, the information on the DSA material, the area, and a design constraint when forming the guide pattern. The method further includes creating a mask pattern of the guide pattern using the guide pattern.

14 Claims, 15 Drawing Sheets

MASK PATTERN CREATION METHOD, RECORDING MEDIUM, AND SEMICONDUCTOR DEVICE MANUFACTURING METHOD

CROSS-REFERENCE TO RELATED APPLICATIONS

This application is based upon and claims the benefit of priority from Japanese Patent Application No. 2012-039788, filed on Feb. 27, 2012; the entire contents of which are incorporated herein by reference.

FIELD

Embodiments described herein relate generally to a mask pattern creation method, a recording medium, and a semiconductor device manufacturing method.

BACKGROUND

In recent years, a DSA (directed self-assembly) process is gathering attention as one of potential candidates for a next-generation lithography process. The DSA process requires designing a guide for controlling creation of patterns. However, there are a lot of restrictions on designing a guide, which makes it difficult for designers themselves to design the guide. Thus, it is desirable to allow mask patterns used in the DSA process to be created easily.

DETAILED DESCRIPTION

In general, according to one embodiment, a mask pattern creation method is provided. The mask pattern creation method includes extracting a DSA pattern formation area in which a DSA material is directed self-assembled to form a DSA pattern, from a design pattern area of the design pattern based on the design pattern of an on-substrate pattern to be formed on a substrate and information on the DSA material that forms patterns using directed self-assembly. The method also includes creating a guide pattern that causes the DSA pattern to be formed in the DSA pattern formation area based on the design pattern, the information on the DSA material, the DSA pattern formation area, and a design constraint when forming the guide pattern. The method further includes creating a mask pattern of the guide pattern using the guide pattern.

Exemplary embodiments of a mask pattern creation method, a recording medium, and a semiconductor device manufacturing method will be explained below in detail with reference to the accompanying drawings. It is noted that the present invention is not limited to the following embodiments.

First Embodiment

Figure 1:
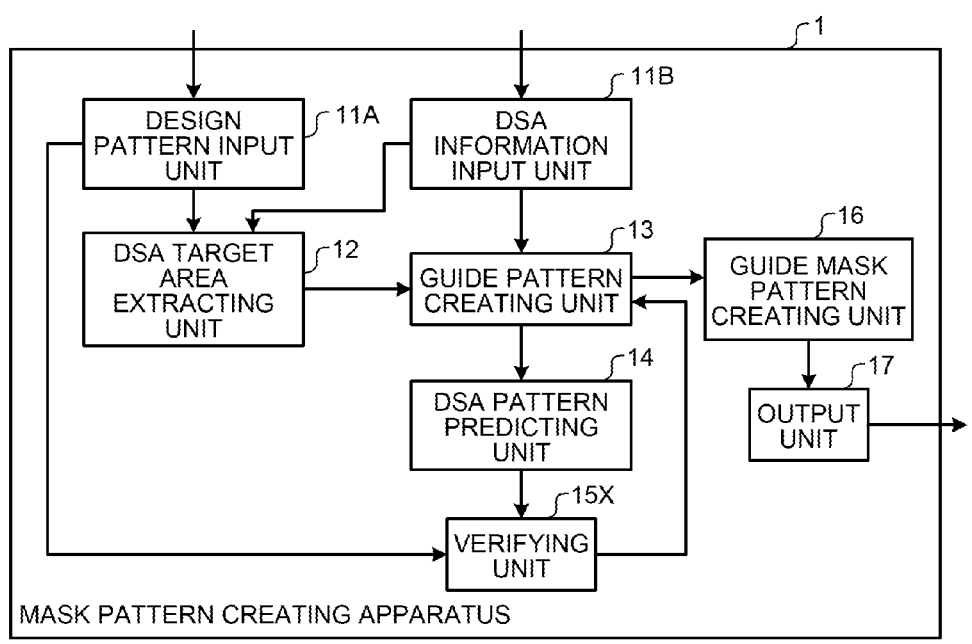
FIG. 1 is a diagram illustrating a configuration of a mask pattern creating apparatus according to a first embodiment.

In the present embodiment, the flow of basic data processing corresponding to a directed self-assembly (DSA) process and an automatic system for creating DSA guides (guide patterns) will be explained. FIG. 1 is a diagram illustrating a configuration of a mask pattern creating apparatus according to a first embodiment. A mask pattern creating apparatus 1 is a computer or the like that creates mask data (mask patterns) used in the DSA process.

The DSA process is a patterning step using directed self-assembly and includes a step of forming a guide pattern on directed self-assembly patterning target areas (hereinafter, referred to as DSA target areas) that are extracted from a design pattern (layout pattern data). The mask pattern creating apparatus 1 of the present embodiment creates mask patterns (hereinafter, referred to as guide mask patterns) for forming the guide pattern.

The mask pattern creating apparatus 1 includes a design pattern input unit 11A, a DSA information input unit 11B, a DSA target area extracting unit 12, a guide pattern creating unit 13, a DSA pattern predicting unit 14, a verifying unit 15X, a guide mask pattern creating unit 16, and an output unit 17.

The design pattern input unit 11A receives a design pattern of a semiconductor device (semiconductor integrated circuit) from an external apparatus or the like and transmits the design pattern to the DSA target area extracting unit 12 and the verifying unit 15X. The DSA information input unit 11B receives the information on DSA from an external apparatus or the like and transmits the DSA information to the DSA target area extracting unit 12 and the guide pattern creating unit 13.

For example, the DSA information is conditions, constraints, and the like required for the DSA process and is referred to when a guide pattern is set. Specifically, examples of the DSA information include the type (line-and-space (L/S) pattern, circular pattern, or the like) of patterns to be formed by the DSA process, the type of DSA molecule (DSA material), constraints associated with a lithography process, accuracy required for the dimension of a pattern.

The DSA target area extracting unit 12 classifies design patterns into a design pattern that can be formed by the DSA process and a guide pattern that is difficult to be formed by the DSA process based on the design pattern and the DSA information.

For example, when an L/S pattern is designated by the DSA information, the DSA target area extracting unit 12 determines that a pattern other than the L/S pattern among the design patterns is a design pattern that is difficult to be formed by the DSA process.

Moreover, the DSA target area extracting unit 12 determines that an L/S pattern that satisfies the DSA information among the L/S patterns of the design pattern is a design pattern that can be formed by the DSA process. The DSA target area extracting unit 12 extracts a DSA target area based on the result of a determination on whether a DSA pattern can be formed or not. In other words, the DSA target area extracting unit 12 of the present embodiment derives the conditions (hereinafter, referred to as DSA setting conditions) for a design pattern, described later, in which a DSA pattern can be set, based on the DSA information and extracts a DSA target area based on the derived DSA setting conditions. The DSA target area extracting unit 12 transmits the extracted DSA target area and a design pattern in the DSA target area to the guide pattern creating unit 13.

The guide pattern creating unit 13 creates a guide pattern for the design pattern in the DSA target area based on the design pattern, the DSA information, and the DSA target area. The guide pattern creating unit 13 of the present embodiment derives the creation constraint conditions for a guide pattern based on the DSA information and creates a guide pattern based on the derived creation constraint conditions. The guide pattern creating unit 13 transmits the created guide pattern to the DSA pattern predicting unit 14.

Moreover, when an out-of-tolerance area that is outside a tolerance range described later is transmitted from the verifying unit 15X, the guide pattern creating unit 13 re-creates a guide pattern for the design pattern included in the out-of-tolerance area based on the design pattern, the DSA information, and the DSA target area. The guide pattern creating unit 13 transmits the re-created guide pattern to the DSA pattern predicting unit 14.

Moreover, when a notification of success is received from the verifying unit 15X, the guide pattern creating unit 13 transmits the guide patterns created or re-created for all of the design patterns in the DSA target area to the guide mask pattern creating unit 16.

The DSA pattern predicting unit 14 predicts directed self-assembled patterns to be formed based on the guide pattern. In the following description, a pattern formed by performing directed self-assembly on the guide pattern will be referred to as a DSA pattern. The DSA pattern predicting unit 14 predicts by simulating which DSA pattern will be formed near a guide pattern by the directed self-assembly if the guide pattern is disposed at a certain position. The DSA pattern predicting unit 14 transmits the predicted DSA pattern to the verifying unit 15X.

The verifying unit 15X verifies whether the dimension of the predicted DSA pattern falls within a tolerance range from target dimension based on the design pattern and the predicted DSA pattern. In other words, the verifying unit 15X verifies whether the dimension of the predicted DSA pattern falls within an allowable range of a dimension defined based on the design pattern. Moreover, the verifying unit 15X verifies whether a process margin when forming the predicted DSA pattern falls within an allowable range.

The verifying unit 15X extracts an area including a DSA pattern which is outside the allowable range among the predicted DSA patterns and transmits the extracted area to the guide pattern creating unit 13 as the out-of-tolerance area. Moreover, when the dimension of all of the DSA patterns falls within the tolerance range from the target dimension, the verifying unit 15X transmits a notification of success to the guide pattern creating unit 13.

The guide mask pattern creating unit 16 creates a guide mask pattern (pattern data) corresponding to the guide pattern transmitted from the guide pattern creating unit 13. The guide mask pattern creating unit 16 transmits the created guide mask pattern to the output unit 17. The output unit 17 outputs the guide mask pattern to an external apparatus (a mask producing apparatus or the like).

Figure 2A:
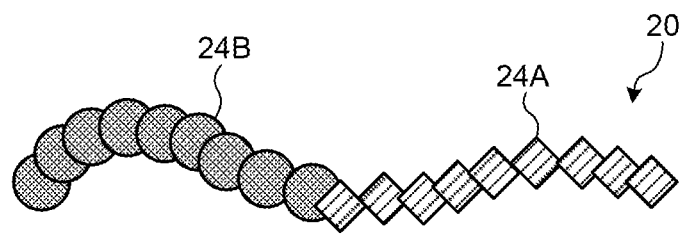
FIGS. 2A and 2B are diagrams illustrating configuration examples of DSA molecules.
Figure 2B:
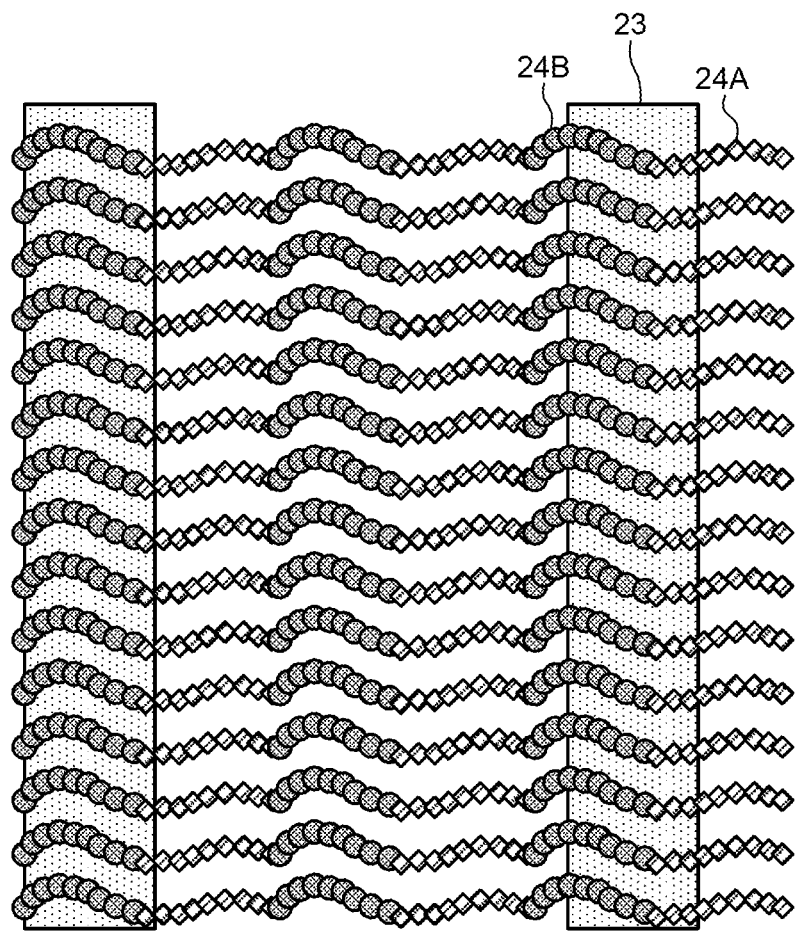

Next, the directed self-assembly and the DSA process will be explained. FIGS. 2A and 2B are diagrams illustrating the configuration examples of a DSA molecule. As illustrated in FIG. 2A, DSA molecules 20 are polymers that include hydrophilic portions 24B and lipophilic portions 24A.

As illustrated in FIG. 2B, when DSA molecules 20 are applied to a guide pattern 23 formed of a hydrophilic material, the hydrophilic portions 24B assemble onto the guide pattern 23. Moreover, the DSA molecules 20 combine with each other such that the ends (the ends close to the hydrophilic portion 24B) of one set of DSA molecules 20 combine with the ends (the ends close to the lipophilic portion 24A) of the other set of DSA molecules 20. In this way, the hydrophilic portions 24B are disposed on the guide pattern 23, and the DSA molecules 20 combine with each other in a linear form in the order of the lipophilic portion 24A, the hydrophilic portion 24B, and the lipophilic portion 24A.

Figure 3A:
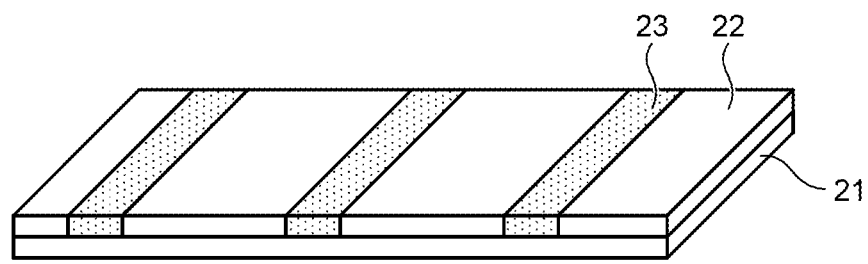
FIGS. 3A to 3C are diagrams for explaining a DSA process.
Figure 3B:
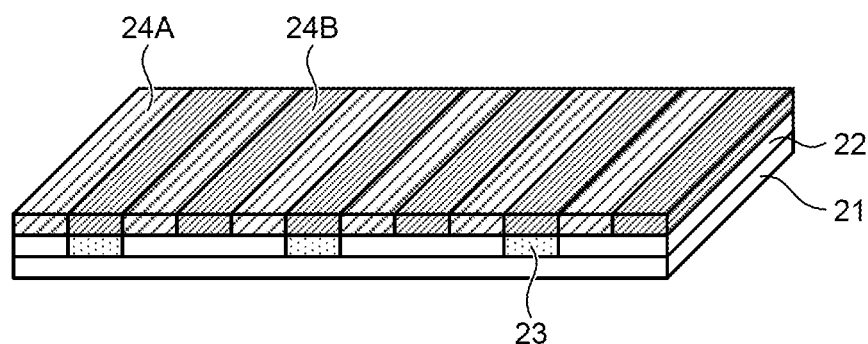
Figure 3C:
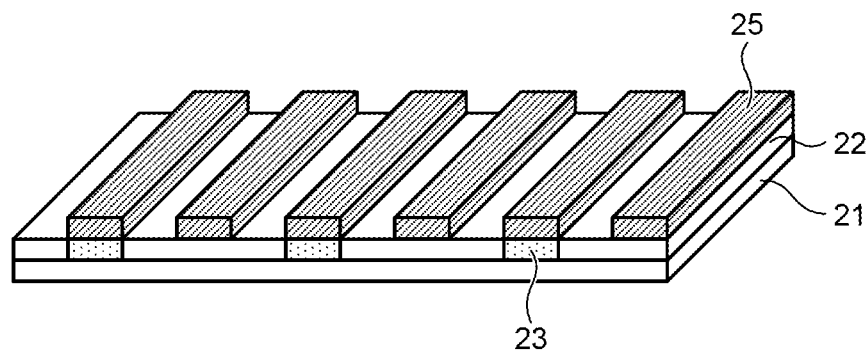

FIGS. 3A to 3C are diagrams for explaining the DSA process. As illustrated in FIG. 3A, the guide pattern 23 is formed on a wafer (substrate) 21. The guide pattern 23 is formed using electron-beam (EB) lithography, for example. Specifically, a guide material is applied to the entire surface of the wafer 21, and a resist is applied to the entire surface of the guide material. The guide material may be neutral, lipophilic, or hydrophilic. Moreover, the guide material is a thin film of several nanometers, for example, and has a negligibly small thickness (step height from the wafer 21). After the resist is applied, a predetermined area on the resist is exposed by EB exposure, whereby a resist pattern is formed. The guide material on the resist pattern is etched and removed, whereby the guide material is patterned. After that, the resist pattern is removed from the guide pattern. In this way, the guide pattern 23 that uses the guide material is formed. In this example, although the guide pattern 23 is a stripe pattern, the shape of the guide pattern 23 is optional.

A hydrophobic film 22 is deposited in areas in the wafer 21 outside the guide pattern 23. The hydrophobic film 22 has the same thickness as the guide pattern 23 and is deposited so as to bury the gaps between the adjacent guide patterns 23. The guide pattern 23 or the hydrophobic film 22 may be formed prior to the other.

The guide pattern 23 is formed of a material different from that of the periphery (the hydrophobic film 22). Moreover, the guide pattern 23 has a surface state (surface roughness or the like) different from that of the hydrophobic film 22. The hydrophobic film 22 may not be formed. In this way, the guide pattern 23 becomes a pattern having a height different from that of the periphery.

Subsequently, the DSA molecules 20 are applied to the upper surfaces of the guide patterns 23 and the hydrophobic films 22. In this way, as illustrated in FIG. 3B, the hydrophilic portions 24B assemble onto the guide patterns 23. Moreover, the DSA molecules 20 assemble onto the hydrophobic films 22 in such a manner that the DSA molecules 20 combine with each other in the order of the lipophilic portion 24A, the hydrophilic portion 24B, and the lipophilic portion 24A. The number of repeated combinations of the lipophilic portions 24A and the hydrophilic portions 24B is determined by the distance between the guide patterns 23 and the length of the DSA molecule 20.

After the DSA molecules 20 are applied to the upper surface of the wafer 21, the lipophilic portions 24A of the DSA molecules 20 are etched. In this way, as illustrated in FIG. 3C, the hydrophilic portions 24B remain on the wafer 21, and the lipophilic portions 24A are removed. FIG. 3C illustrates a case where the hydrophilic portions 24B between the adjacent guide patterns 23 remain, and DSA patterns 25 are formed at pitches twice shorter than those of the guide patterns 23. As above, the DSA patterns 25 are patterned at constant pitches along the guide patterns 23.

The width of an underlying guide (the hydrophobic film or the hydrophilic film) is not necessarily identical to the width of the DSA pattern. For example, although FIG. 3C illustrates a case where the width of the guide pattern 23 is identical to the width of the DSA pattern 25, the width of the guide pattern 23 may be different from the width of the DSA pattern 25. For example, the DSA pattern 25 may be formed so as to have a width smaller than the width of the guide pattern 23.

Figure 4A:
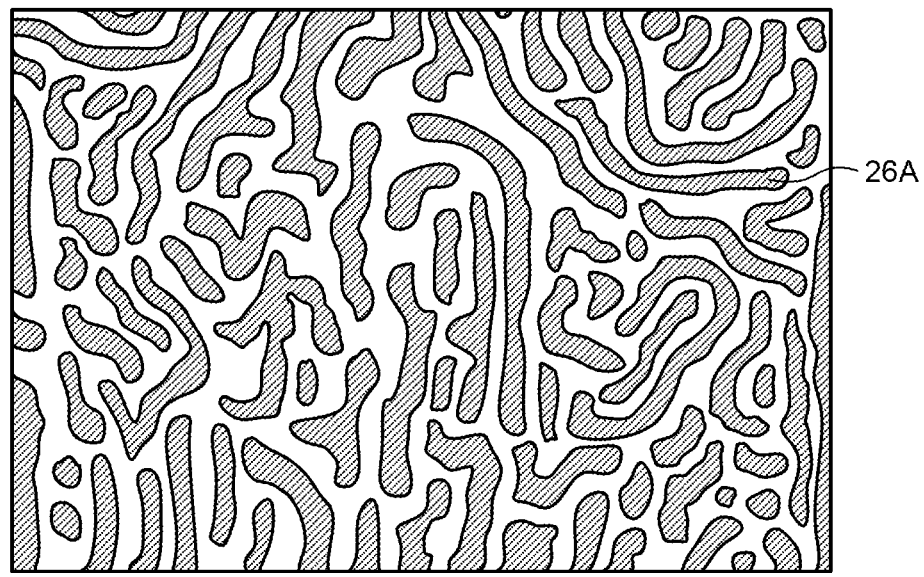
FIGS. 4A and 4B are diagrams illustrating examples of a DSA pattern.
Figure 4B:
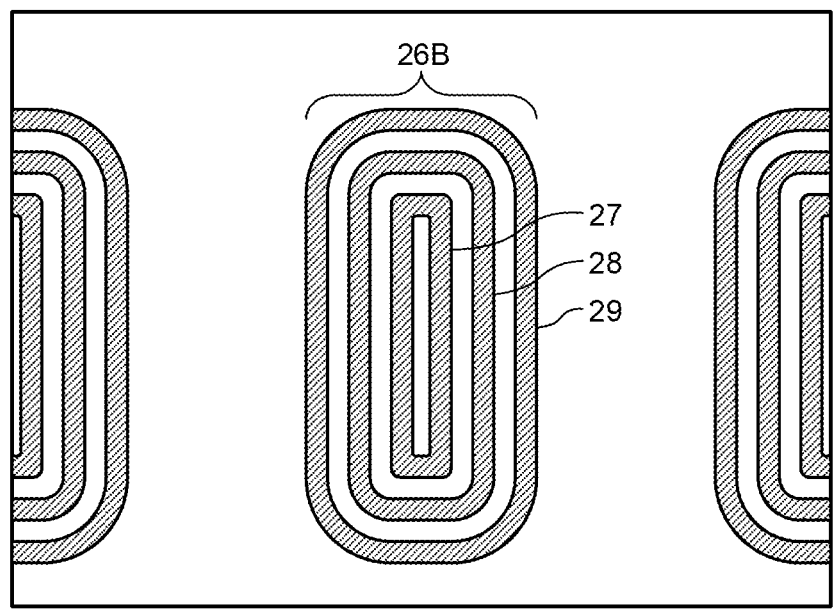

FIGS. 4A and 4B are diagrams illustrating an example of the DSA pattern. FIGS. 4A and 4B illustrate a top view of the DSA pattern. FIG. 4A illustrates a DSA pattern 26A formed in an area where the guide pattern is not present. FIG. 4B illustrates a DSA pattern 26B formed in an area where the guide pattern 23 is present.

As illustrated in FIG. 4A, the DSA pattern 26A formed in an area where the guide pattern is not present has approximately constant pattern width and space width. However, the pattern shape is random and aperiodic.

On the other hand, as illustrated in FIG. 4B, the DSA pattern 26B formed in an area where the guide pattern is present has approximately constant pattern width and space width and has a shape corresponding to the layout of the guide patterns. For example, when the guide pattern has a ring-shape having a diameter greater than a predetermined value, the DSA pattern 26B also has a ring-shape. FIG. 4B illustrates a case where a second ring-shaped DSA pattern 28 is formed so as to surround a first ring-shaped DSA pattern 27, and a third ring-shaped DSA pattern 29 is formed so as to surround the second ring-shaped DSA pattern 28.

Although a DSA pattern in areas outside the formation area of the ring-shaped DSA pattern 26B is not illustrated in FIG. 4B, actually, the random DSA patterns 26A are formed in the outside areas. The random DSA patterns 26A have the same pitches (approximately constant pattern width and space width) as those of the ring-shaped DSA patterns 26B.

Moreover, the pattern width and space width of the DSA patterns 26A and 26B are determined by the structure of the DSA molecule 20. Specifically, the pattern width of the DSA patterns 26A and 26B is approximately the same value as the length of the hydrophilic portion 24B, and the space width of the DSA patterns 26A and 26B is approximately the same as the length of the lipophilic portion 24A.

Figure 5:
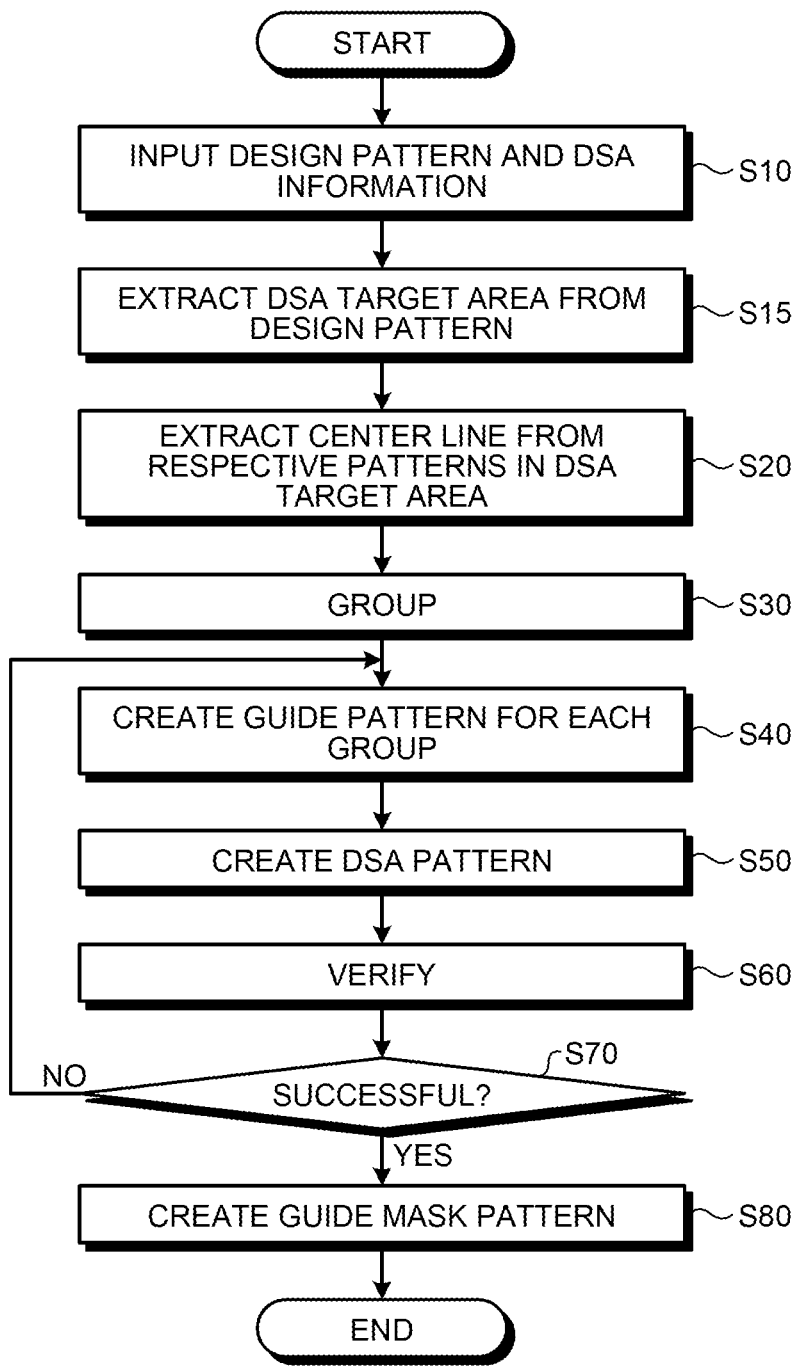
FIG. 5 is a flowchart illustrating the flow of a guide mask pattern creation process according to the first embodiment.

Next, the flow of a guide mask pattern creating process will be explained. FIG. 5 is a flowchart illustrating the flow of a guide mask pattern creating process according to the first embodiment. A design pattern is input to the design pattern input unit 11A of the mask pattern creating apparatus 1, and DSA information is input to the DSA information input unit 11B (step S10).

The design pattern input unit 11A transmits the design pattern to the DSA target area extracting unit 12 and the verifying unit 15X, and the DSA information input unit 11B transmits the DSA information to the DSA target area extracting unit 12 and the guide pattern creating unit 13. In this example, a case where the type of the DSA pattern designated in the DSA information is an L/S pattern will be explained.

Here, the DSA information will be explained. The DSA information includes various items of information such as (1) the type of the DSA molecule 20, (2) the constraint (lithography constraint) associated with a lithography process, (3) the accuracy (guide dimension requirement accuracy) required for the dimension of the guide pattern, and (4) the accuracy (DSA dimension requirement accuracy) required for the dimension of the DSA pattern.

(1) The type of the DSA molecule 20 includes information on the length of the hydrophilic portion 24B and the length of the lipophilic portion 24A.

(2) The lithography constraint is information representing which guide pattern can be formed when the lithography process is used. For example, when a guide pattern is formed using optical lithography, there is a limit (resolution limit) in the dimension of a guide pattern that can be formed by optical lithography. Moreover, a roughness occurs in the edges of a pattern due to the resolution limit of optical lithography. Such a resolution limit, a roughness range, and the like are set as the lithography constraint. In creating the guide pattern, the resolution limit and the roughness range are taken into consideration.

The DSA information may include a process constraint other than the lithography constraint as a design constraint when forming the guide pattern on the wafer 21. In this case, the process constraint is the constraint on the minimum pitch and the minimum space width of a process used when forming the guide pattern on the wafer 21.

(3) The guide dimension requirement accuracy is information representing the accuracy of the dimension (pattern width and space width) that is to be met by the guide pattern.

(4) The DSA dimension requirement accuracy is information representing the accuracy of the dimension (patter width and space width) that is to be met by the DSA pattern.

The DSA target area extracting unit 12 derives the setting constraint condition of a DSA target area based on the design pattern and the DSA information. Specifically, the DSA target area extracting unit 12 derives the DSA setting condition based on at least one of the type of the DSA molecule 20, the DSA dimension requirement accuracy, and the like.

Since the length of the lipophilic portion 24A or the hydrophilic portion 24B is different depending on the type of the DSA molecule 20, the pitch of the DSA patterns that can be formed is also different depending on the type of the DSA molecule 20. Thus, the DSA target area extracting unit 12 derives the condition of a design pattern that can be formed using the DSA molecule 20 and that meets the DSA dimension requirement accuracy among the design patterns as the DSA setting condition. The DSA setting condition includes a pitch range of the design pattern, for example, and a design pattern area that meets the pitch range is extracted as the DSA target area (step S15). The DSA target area extracting unit 12 sends the extracted DSA target area to the guide pattern creating unit 13.

Here, the periodicity of DSA patterns will be explained. The periodicity of DSA patterns is different depending on the type of the DSA molecule 20. For example, the periodicity of the DSA pattern has a length according to Expression (1) below.

$$D=4(3/\pi^2)^{1/3}aN^{2/3}\chi^{1/6} \qquad (1)$$

Expression (1) is a formula that represents the periodic length of the Lamellar structure. In Expression (1), "a" is the length of a polymer bond, and "N" is the number of bonds. In Expression (1), a polymer is treated as a chain in which "N" bonds (N is a natural number) of length "a" are connected by joint points such that the bonds can be freely bent, and the length of the polymer is defined using a random flight model. Since in Expression (1), a combination of several monomer units is treated as a statistical repetition unit, the length calculated in Expression (1) does not directly correspond to a bond distance of molecular monomers. The DSA information may include the information on the parameters of Expression (1) such as "a," "N," and "χ" and may include the information on "D."

The guide pattern creating unit 13 derives a guide pattern creation constraint condition for the design patterns in the DSA target area based on the design pattern, the DSA information, and the DSA target area. Specifically, the guide pattern creating unit 13 derives the guide pattern creation constraint condition based on at least one of the type of the DSA molecule 20, the lithography constraint, the guide dimension requirement accuracy, the DSA dimension requirement accuracy, and the like.

As the lithography constraint, the resolution limit and the roughness range are set. The guide pattern creating unit 13 derives a guide pattern width and an inter-guide-pattern distance as the guide pattern creation constraint condition based on the resolution limit, the roughness range, and the guide dimension requirement accuracy. For example, even when the roughness range is provided to the dimension of a guide pattern to be formed, the guide pattern creating unit 13 sets a guide pattern width that meets the guide dimension requirement accuracy.

The guide pattern creating unit 13 creates a guide pattern such that the design patterns in the DSA target area can be formed by the DSA pattern, and the guide pattern creation constraint condition is met. In order to create the guide pattern, the guide pattern creating unit 13 extracts the center lines from the respective design patterns in the DSA target area (step S20).

Figure 6:
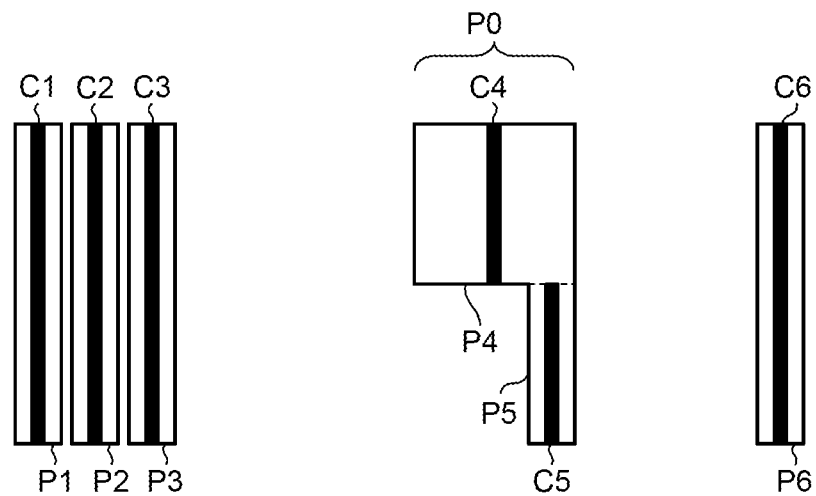
FIG. 6 is a diagram for explaining center lines extracted from a design pattern.

FIG. 6 is a diagram for explaining the center lines extracted from the design patterns. FIG. 6 illustrates a case where design patterns P1 to P6 are present in the DSA target area. The design patterns P1 to P3 and P6 are line patterns. Center lines C1 to C3 and C6 are extracted from the design patterns P1 to P3 and P6 as center lines that are parallel to the longitudinal direction of the line patterns.

Moreover, a design pattern P0 is a flag-shaped pattern and is made up of rectangular guide patterns P4 and P5. The design pattern P5 is a line pattern, and a center line C5 that is parallel to the longitudinal direction of the line pattern is extracted from the design pattern P5 similarly to the design pattern P1 and the like. Moreover, a center line C4 that is parallel to the center line C5 of the design pattern P5 is extracted from the design pattern P4.

After the center lines are extracted from the respective design patterns in the DSA target area, the guide pattern creating unit 13 groups the extracted center lines (step S30). The guide pattern creating unit 13 groups the respective center lines based on an inter-center-line distance.

Specifically, the guide pattern creating unit 13 sets a prescribed value of the inter-center-line distance based on the length of the lipophilic portion 24A or the hydrophilic portion 24B. Moreover, the guide pattern creating unit 13 extracts a center line pair that is within the prescribed value of the inter-center-line distance and extracts the center lines that constitute the center line pair.

Figure 7:
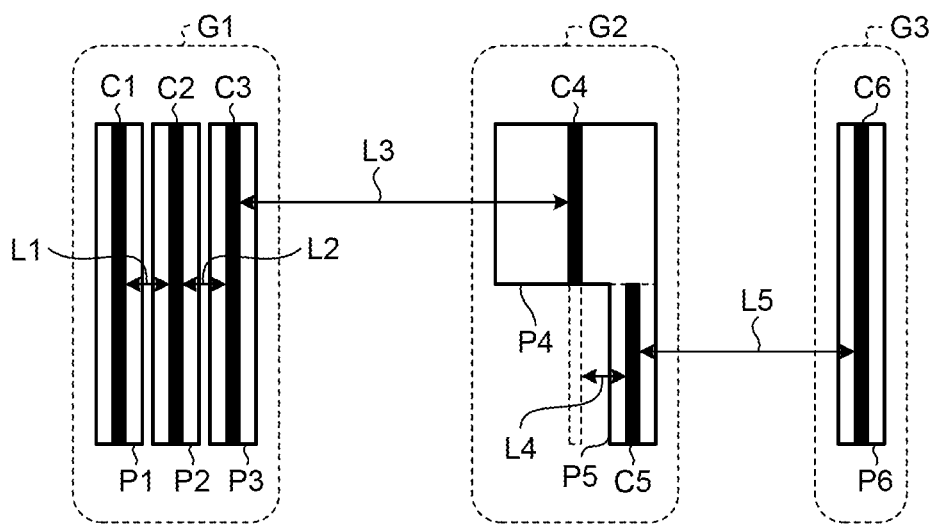
FIG. 7 is a diagram for explaining a center line grouping process.

FIG. 7 is a diagram for explaining the center line grouping process. In this example, a case where the center lines C1 to C6 described in FIG. 6 are grouped will be explained. The inter-center-line distances of the center lines C1-C2, C2-C3, C3-C4, C4-C5, and C5-C6 are defined as L1 to L5, respectively. When the prescribed value of the inter-center-line distance is "Lx," the guide pattern creating unit 13 extracts inter-center-line distances that are smaller than the prescribed value "Lx." The prescribed value "Lx" is the length of two DSA molecules 20 being connected, for example.

For example, when the inter-center-line distances that are smaller than the prescribed value "Lx" are L1, L2, and L4, the inter-center-line distances L1, L2, and L4 are extracted. Moreover, the center lines C1 and C2 that constitute the inter-center-line distance L1 are grouped into the same group, the center lines C2 and C3 that constitute the inter-center-line distance L2 are grouped into the same group, and the center lines C4 and C5 that constitute the inter-center-line distance L4 are grouped into the same group. Further, since the center line C2 is a constituent component of both of the inter-center-line distances L1 and L2, the center lines C1, C2, and C3 are grouped into the same group. In other words, the center lines C1, C2, and C3 that are adjacent within the prescribed value "Lx" are grouped into the same group. Moreover, the center lines C4 and C5 that are adjacent within the prescribed value "Lx" are grouped into the same group.

In this way, the guide pattern creating unit 13 sets the center lines C1, C2, and C3 to belong to a first group G1, the center lines C4 and C5 to a second group G2, and the center line C6 to a third group G3.

Figure 8:
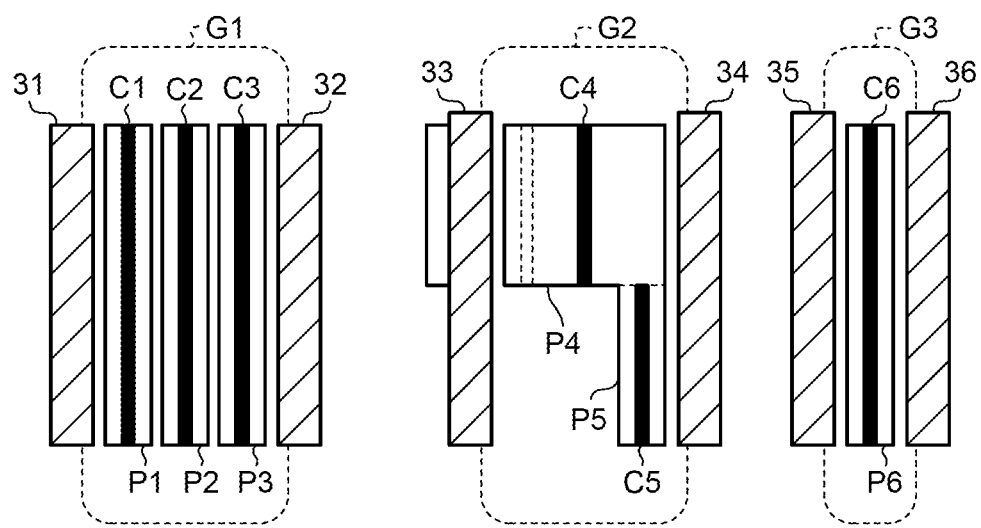
FIG. 8 is a diagram for explaining a guide pattern creation process for each group.

After the center lines are grouped, the guide pattern creating unit 13 creates a guide pattern for each group (step S40). FIG. 8 is a diagram for explaining a guide pattern creation process for each group. In this example, a case where the guide pattern is created for the first to third groups G1 to G3 described in FIG. 7 will be explained.

The guide pattern creating unit 13 disposes guide patterns 31 and 32 at both ends of the first group G1. Specifically, the guide pattern 31 is disposed on the outer side (left side) than the center line C1 that is disposed on one end (left end) side of the first group G1. Moreover, the guide pattern 32 is disposed on the outer side (right side) than the center line C3 that is disposed on the other end (right end) side of the first group G1.

In this case, for example, the guide patterns 31 and 32 are disposed so that the space width between the guide pattern 31 and the center line C1, the space width between the center lines C1 and C2, the space width between the center lines C2 and C3, and the space width between the guide pattern 32 and the center line C3 are approximately the same. Moreover, the dimension in the longitudinal direction of each of the guide patterns 31 and 32 is set to be the same as the dimension in the longitudinal direction of each of the center lines C1 and C2 (design patterns P1 and P2).

Similarly, the guide pattern creating unit 13 disposes guide patterns 33 and 34 at both ends of the second group G2. Specifically, the guide pattern 33 is disposed on the outer side (left side) than the center line C4 that is disposed on one end (left end) side of the second group G2. Moreover, the guide pattern 34 is disposed on the outer side (right side) than the center line C5 that is disposed on the other end (right end) side of the second group G2.

In this case, the guide patterns 33 and 34 are disposed so that the space width between the guide pattern 33 and the center line C3, the space width between the center lines C4 and C5, and the space width between the guide pattern 34 and the center line C4 are approximately the same. Moreover, the dimension in the longitudinal direction of each of the guide patterns 33 and 34 is set to be the same as the dimension in the longitudinal direction of the design pattern P0 (the combined design patterns P4 and P5) (the sum of the lengths of the center lines C4 and C5).

Similarly, the guide pattern creating unit 13 disposes guide patterns 35 and 36 at both ends of the third group G3. Specifically, the guide pattern 35 is disposed on the outer side (left side) than the center line C6 that is disposed in the third group, and the guide pattern 36 is disposed on the outer side (right side) than the center line C6.

In this case, the guide patterns 35 and 36 are disposed so that the space width between the guide pattern 35 and the center line C6 and the space width between the guide pattern 36 and the center line C6 are approximately the same as the space width between the center lines C1 and C2 and the space width between the center lines C4 and C5. Moreover, the dimension in the longitudinal direction of each of the guide patterns 35 and 36 is set to be the same as the dimension in the longitudinal direction of the center line C6 (the design pattern P6).

The pattern width of the guide patterns 31 to 36 is not necessarily the same as the pattern width of the design pattern P1 or the like but may be greater or smaller by a predetermined value. The guide pattern creating unit 13 transmits the created guide pattern to the DSA pattern predicting unit 14. The DSA pattern predicting unit 14 predicts a DSA pattern to be formed based on the guide pattern and creates the predicted DSA pattern (step S50).

Figure 9:
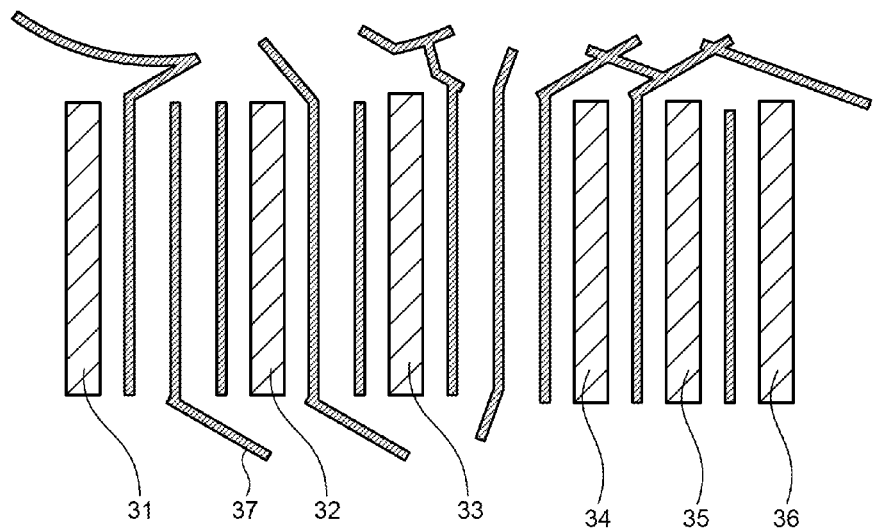
FIG. 9 is a diagram for explaining DSA patterns formed using a guide pattern.

FIG. 9 is a diagram for explaining the DSA patterns formed using the guide patterns. In this example, a case where DSA patterns 37 are formed using the guide patterns 31 to 36 described in FIG. 8 will be explained.

Between the respective guide patterns, DSA patterns 37 are formed at equal pitches in a number corresponding to the inter-guide-pattern distance and the length of the DSA molecule 20. When the DSA patterns 37 are formed using the guide patterns 31 to 36, DSA patterns 37 of predetermined width are formed near the guide patterns at positions separated by a predetermined distance from the guide patterns, for example. Moreover, another DSA pattern 37 is formed between the adjacent two DSA patterns 37. In this case, the DSA patterns 37 are formed so that the arrangement intervals of the DSA patterns 37 are approximately the same.

For example, three DSA patterns 37 are formed between the guide patterns 31 and 32. Moreover, two DSA patterns 37 are formed between the guide patterns 33 and 34, and one DSA pattern 37 is formed between the guide patterns 35 and 36.

Figure 10:
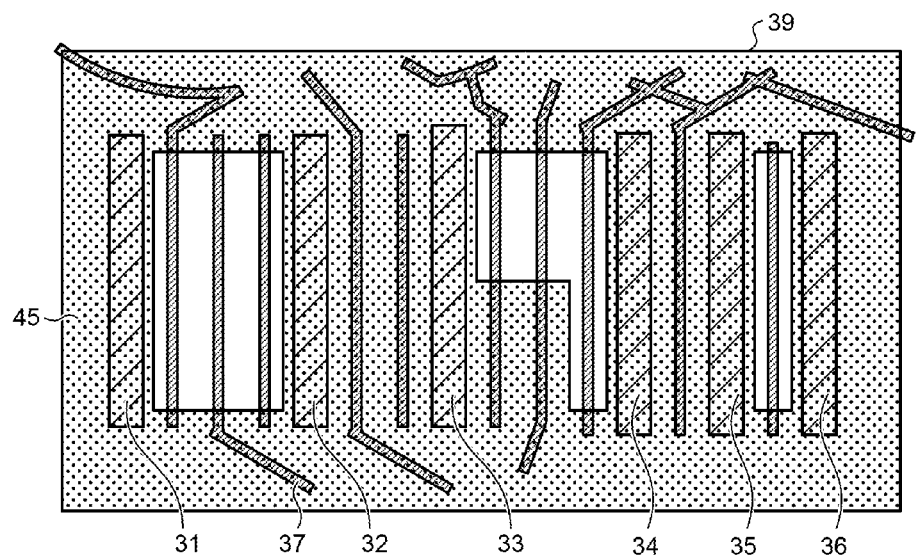
FIG. 10 is a diagram for explaining a process of removing DSA patterns formed at unnecessary positions.
Figure 11:
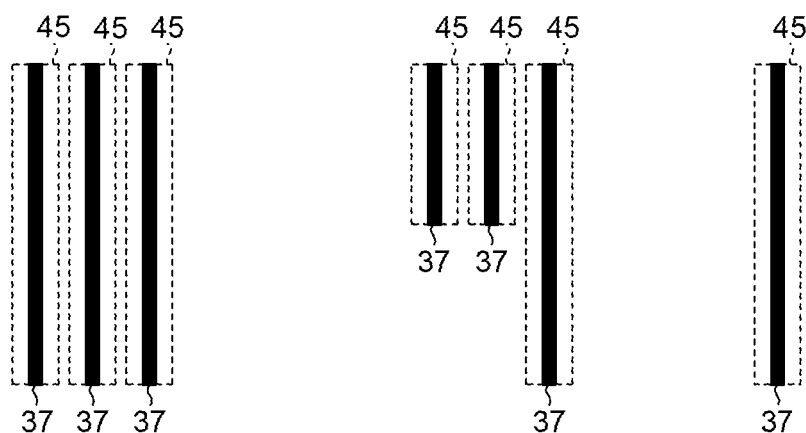
FIG. 11 is a diagram for explaining a DSA pattern width adjustment process.

Moreover, the DSA pattern 37 is also formed on the respective guide patterns 31 to 36. In FIGS. 9 to 11, the DSA patterns 37 formed on the guide patterns 31 to 36 are not illustrated.

Further, random-shaped DSA patterns 37 are formed at random positions in areas (places where the DSA patterns are not controllable by the guide patterns) outside the areas between the respective guide patterns. When the DSA patterns 37 to be formed using the guide patterns are predicted, the DSA pattern predicting unit 14 transmits the predicted DSA patterns 37 to the verifying unit 15X.

The verifying unit 15X verifies whether the dimension of the DSA pattern 37 in the DSA target area falls within the tolerance range from a target dimension among the predicted DSA patterns 37 (step S60). When the dimension of the DSA pattern 37 does not fall within the tolerance range (No in step S70), the verifying unit 15X extracts an area including the out-of-tolerance DSA pattern 37 among the predicted DSA patterns 37. Moreover, the verifying unit 15X transmits the extracted area to the guide pattern creating unit 13 as an out-of-tolerance area.

When the out-of-tolerance area is transmitted from the verifying unit 15X, the guide pattern creating unit 13 re-creates a guide pattern for the design patterns that are included in the out-of-tolerance area based on the DSA information. In this case, the guide pattern creating unit 13 re-creates the guide pattern so that the guide pattern is successfully verified.

The guide pattern creating unit 13 transmits the re-created guide patterns to the DSA pattern predicting unit 14, and the DSA pattern predicting unit 14 re-predicts the DSA patterns. Moreover, the verifying unit 15X re-verifies whether the dimension of the predicted DSA pattern falls within the tolerance range from a target dimension. In this way, the guide pattern creating unit 13, the DSA pattern predicting unit 14, and the verifying unit 15X repeatedly perform the processes of steps S40 to S70 until the dimension of all of the DSA patterns falls within the tolerance range.

When the dimensions of all the DSA patterns fall within the tolerance range of the target value (Yes in step S70), the verifying unit 15X transmits a notification of success to the guide pattern creating unit 13. Upon receiving the notification of success from the verifying unit 15X, the guide pattern creating unit 13 transmits the created or re-created guide patterns to the guide mask pattern creating unit 16. The guide mask pattern creating unit 16 creates a guide mask pattern corresponding to the guide patterns transmitted from the guide pattern creating unit 13 (step S80).

When the DSA patterns are formed using the guide patterns, the DSA patterns are formed at unnecessary positions. For example, the unnecessary DSA patterns are the random-shaped DSA patterns which are formed in areas outside the areas between the respective guide patterns. Thus, the DSA patterns formed at the unnecessary positions are removed.

FIG. 10 is a diagram for explaining a process of removing DSA patterns formed at unnecessary positions. In this example, a case where the DSA patterns 37 formed at the unnecessary positions among the DSA patterns 37 described in FIG. 9 are removed will be explained.

DSA patterns 37 that are necessary among the DSA patterns 37 are the DSA patterns 37 in the DSA target area. Thus, the DSA patterns 37 outside the DSA target area are removed. For example, when the unnecessary DSA patterns 37 are removed using optical lithography, a removal mask for removing the unnecessary DSA patterns 37 is used. This removal mask has a configuration in which a removal mask pattern 39 is formed at a position corresponding to the DSA target area, and no mask pattern is formed at a position outside the DSA target area. When optical lithography is performed using this removal mask, the DSA patterns 37 in the DSA target area remain on the substrate.

After the unnecessary DSA patterns 37 are removed, the widths of the DSA patterns 37 are adjusted to a desired width. FIG. 11 is a diagram for explaining a design pattern width adjustment process. In this example, a case where the width of the DSA pattern 37 remaining on the wafer after the removal process described in FIG. 10 is adjusted will be explained.

For example, when the width of the DSA pattern 37 is smaller than a desired width (the width of a design pattern), the width of the DSA pattern 37 is increased to become the desired width defined on the design pattern. Specifically, a film is deposited on the DSA pattern 37 so that a film is formed on the upper and side surfaces of the DSA pattern 37. After that, when the film formed on the upper surface of the DSA pattern 37 is removed by etching-back, the film formed on the side surfaces of the DSA pattern 37 remains. In this way, a DSA pattern 45 in which the width of the DSA pattern 37 is adjusted to the desired width is formed.

In this case, the pattern width of the DSA pattern 37 (not illustrated) formed on the guide pattern is also adjusted in a manner similar to the above. Since the DSA pattern 37 and the guide pattern are thickened by approximately the same dimension, when forming the guide pattern, the guide pattern is formed to a dimension taking the thickening dimension into consideration.

The pattern formed by the DSA process is not limited to the line pattern but may be a circular pattern. In this case, the circular pattern may be a hole pattern which is a concave pattern (removed pattern) and may be a pillar pattern which is a convex pattern (remaining pattern).

Figure 12:
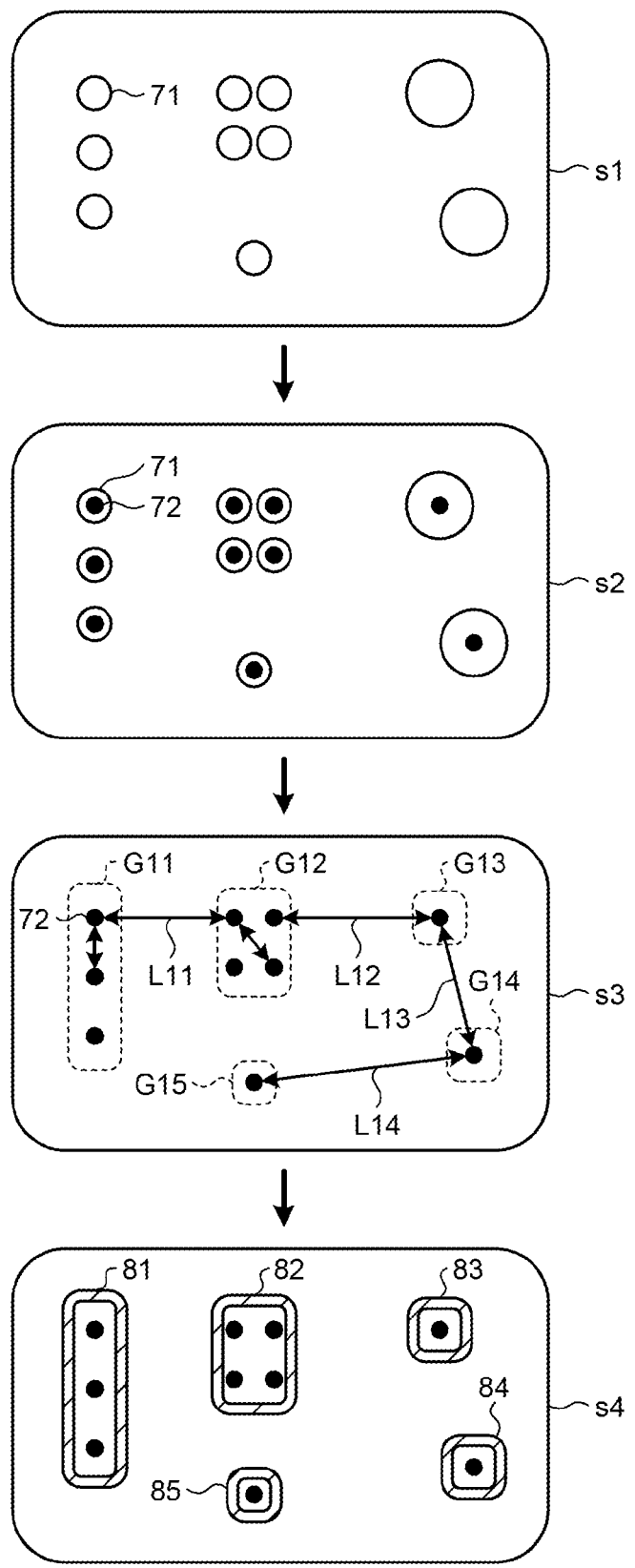
FIG. 12 is a diagram illustrating the flow of a guide pattern creation process when circular patterns are formed by a DSA process.

FIG. 12 is a diagram illustrating the flow of a guide pattern creating process when circular patterns are formed by the DSA process. The description of the same process as that of the case of forming L/S patterns by the DSA process will not be provided.

The design pattern of circular patterns 71 is input to the design pattern input unit 11A of the mask pattern creating apparatus 1 (s1). The guide pattern creating unit 13 extracts the center points 72 from the respective circular patterns 71 in the DSA target area (s2). Further, the guide pattern creating unit 13 groups the center points 72 based on an inter-center-point distance of the respective center points 72 (s3). In this example, a case where the center points 72 are grouped into five groups G11 to G15. As for the respective center points 72 in the groups G11 to G15, the inter-center-point distance between the adjacent circular patterns is smaller than a prescribed value. On the other hand an inter-center-point distance L11 between the groups G11 and G12, an inter-center-point distance L12 between the groups G12 and G13, an inter-center-point distance L13 between the groups G13 and G14, and an inter-center-point distance L14 between the groups G14 and G15 are greater than the prescribed value.

After the center points 72 are grouped, the guide pattern creating unit 13 creates the guide patterns for each group (s4). In this example, a case where ring-shaped guide patterns 81 to 85 are created for the groups G11 to G15, respectively, will be explained.

Figure 13:
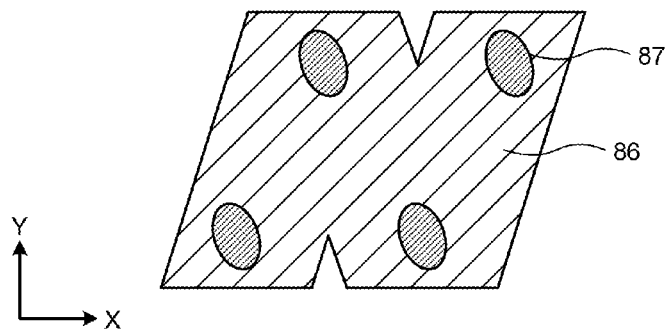
FIG. 13 is a diagram illustrating a configuration example of a guide pattern for forming elliptical patterns.

The circular patterns formed by the DSA process may be elliptical patterns having an elliptical upper surface. FIG. 13 is a diagram illustrating a configuration example of a guide pattern for forming elliptical patterns. By forming a guide pattern into an approximately parallelogram shape like a guide pattern 86, it is possible to form an elliptical DSA pattern 87. In other words, when the angle between the vertical side and the lateral side of the guide pattern 86 is shifted from the right angle, the shape of the DSA pattern 87 deviates from the circular shape by the shift amount. As above, the shape (orientation and position) of the DSA pattern 87 is influenced by the shape (orientation and position) of the guide pattern 86.

Even when the guide pattern is formed into an approximately parallelogram shape like the guide pattern 86, the DSA pattern 87 does not always have an elliptical shape but may have a circular shape.

Here, the difference between the DSA process and a process using sub-resolution assist feature (SRAF) will be explained. SRAF is a pattern used for forming an on-substrate pattern without forming a guide pattern, whereas the DSA pattern is a pattern which is formed on a substrate using a guide pattern which has already been formed.

Moreover, since the SRAF is a pattern for increasing the resolution and is not resolved on a wafer, the SRAF is not formed on the wafer. On the other hand, the guide pattern is a pattern that is actually formed on the wafer.

Further, the difference between the DSA process and a sidewall process will be explained. The patter formed by the sidewall process is a pattern used for forming an on-substrate pattern without forming a guide pattern, whereas the DSA pattern is a pattern which is formed on a substrate using a guide pattern which has already been formed.

Moreover, in the case of the sidewall process, a sidewall pattern formed subsequently to a core material is formed in a state of being in contact with the sidewall portion of the core material. The core material is removed in a subsequent step. On the other hand, in the DSA process, the DSA patterns are formed on the guide patterns and at positions separated from the guide patterns. In other words, the guide patterns do not need to be in contact with the DSA patterns which are formed later at the sidewall portions. Moreover, the guide patterns remain on the substrate without being removed.

As above described, the DSA process and the SRAF process are different in terms of the patterns used for the processes, the patterns formed on the wafer, and the like. Moreover, the DSA process and the sidewall process are different in terms of the patterns used for the processes, the positions of the patterns formed on the wafer, and the like.

For example, when an on-substrate pattern is formed using the sidewall process, the pattern width of a sidewall pattern formed on the left sidewall of a core material is different from the pattern width of a sidewall pattern formed on the right sidewall of the core material. Thus, the sidewall patterns have different pitches every two pattern. On the other hand, the DSA patterns formed using the DSA process have a constant pitch.

Moreover, when an on-substrate pattern is formed using multiple exposure such as double exposure, the position of an on-substrate pattern formed by the first exposure is different from the position of an on-substrate pattern formed by the n-th (n is a natural number) exposure even if the two on-substrate patterns are on the same layer. On the other hand, such a positional shift between patterns in the same layer does not occur in the DSA patterns formed using the DSA process.

Thus, in the DSA process, it is possible to suppress the occurrence of a positional shift or a dimensional shift even when the DSA patterns have a pitch of 38 nm or smaller, for example.

DSA patterns having different pitches may be formed on the same layer. In this case, DSA patterns having the same pitch are sequentially formed in the order of pitches. For example, areas of a substrate outside a first area are covered by a resist pattern, and DSA molecules having a first pitch are dropped on the substrate. In this way, DSA patterns having the first pitch are formed in the first area. Similarly, areas of the substrate outside the m-th (m is a natural number) area are covered by a resist pattern, and DSA molecules having the m-th pitch are dropped on the substrate. In this way, DSA patterns having the m-th pitch are formed in the m-th area.

The resist may be dropped without covering areas outside a desired resist dropping area with a resist pattern. For example, in the case of the ring-shaped guide patterns 81 to 85 described in FIG. 12, when the resist is dropped in the inner sides of the guide patterns 81 to 85, it is not necessary to cover non-desired areas with a resist pattern.

In the present embodiment, a case where guide patterns are created for each group has been described. However, guide patterns corresponding to a design pattern may be stored in advance in a database (DB) and the guide patterns may be extracted from the DB. In this case, pattern matching is performed on the design pattern of the DSA target area and the design pattern in the DB. When the matching design pattern is stored in the DB, the guide patterns corresponding to the design pattern are allocated to the DSA target area. Moreover, the same design pattern as the design pattern in the DB may be extracted from all design patterns, and the guide patterns corresponding to the extracted design pattern may be allocated to the DSA target area.

As above, according to the first embodiment, the DSA target area is extracted from the design patterns based on the design patterns and the DSA information, and the guide patterns are created for the design patterns in the DSA target area. Thus, it is possible to easily create the mask pattern (guide mask pattern) of the guide patterns used in the DSA process.

Moreover, the center lines are grouped based on the inter-center-line distance of the design patterns, and the guide patterns are created for each group. Thus, it is possible to easily create the guide mask pattern.

Further, it is verified whether the dimension of the DSA pattern falls within an allowable range, and the guide pattern is corrected so that the dimension thereof falls within the allowable range when the dimension does not fall within the allowable range. Thus, it is possible to create the guide mask pattern accurately.

Second Embodiment

Next, a second embodiment of this invention will be explained with reference to FIGS. 14 to 17. In the second embodiment, a removal mask pattern of a removal mask used for removing unnecessary DSA patterns is created.

Figure 14:
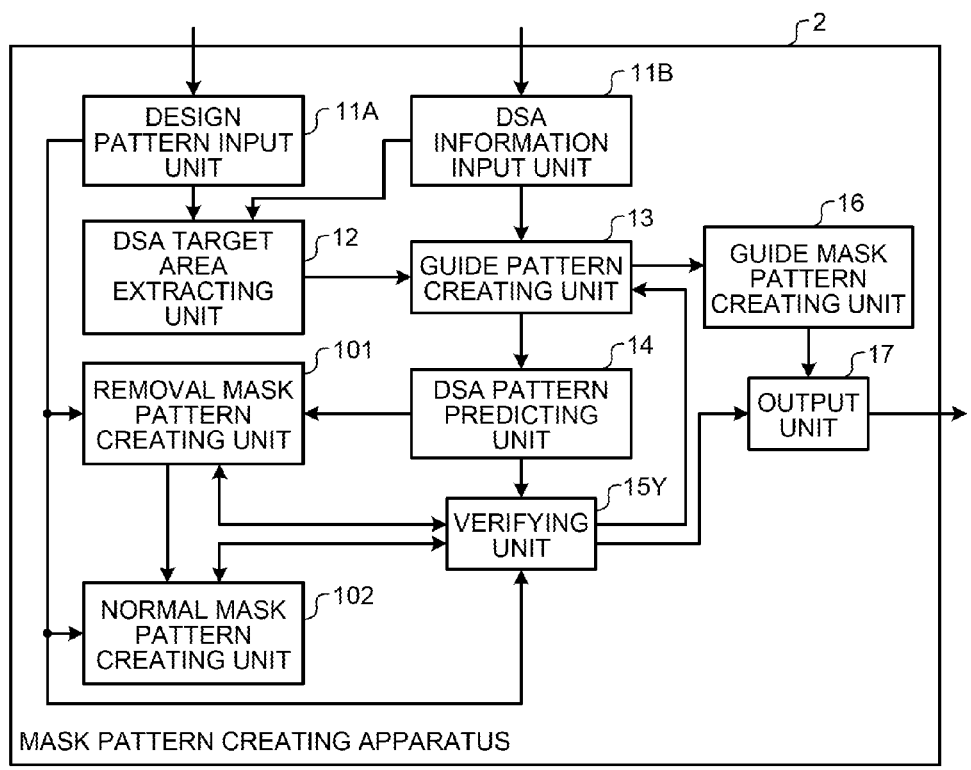
FIG. 14 is a diagram illustrating a configuration of a mask pattern creating apparatus according to a second embodiment.

FIG. 14 is a diagram illustrating the configuration of a mask pattern creating apparatus according to the second embodiment. Among the respective constituent components of FIG. 14, constituent components that realize the same functions as those of the mask pattern creating apparatus 1 of the first embodiment will be denoted by the same reference numerals, and redundant description thereof will not be provided.

A mask pattern creating apparatus 2 includes a removal mask pattern creating unit 101 and a normal mask pattern creating unit 102 in addition to a design pattern input unit 11A, a DSA information input unit 11B, a DSA target area extracting unit 12, a guide pattern creating unit 13, a DSA pattern predicting unit 14, a verifying unit 15Y, a guide mask pattern creating unit 16, and an output unit 17.

The design pattern input unit 11A of the mask pattern creating apparatus 2 transmits a design pattern input from an external apparatus or the like to the DSA target area extracting unit 12, the verifying unit 15Y, the removal mask pattern creating unit 101, and the normal mask pattern creating unit 102. Moreover, the DSA pattern predicting unit 14 transmits predicted DSA patterns to the verifying unit 15Y and the removal mask pattern creating unit 101.

The removal mask pattern creating unit 101 extracts DSA patterns that are formed at unnecessary positions among the DSA patterns based on the design pattern and the DSA pattern. The unnecessary DSA patterns are DSA patterns having shapes and sizes different from those of the design patterns among the formed DSA patterns. The removal mask pattern creating unit 101 transmits information representing areas (unnecessary areas) where the extracted DSA patterns are disposed to the normal mask pattern creating unit 102.

Moreover, the removal mask pattern creating unit 101 creates a mask pattern (hereinafter, referred to as a removal mask pattern) of the removal mask based on the unnecessary areas. The removal mask is a mask for removing the unnecessary DSA patterns. The removal mask pattern created by the removal mask pattern creating unit 101 may be a mask pattern of a photomask and may be a mask pattern (template pattern) of an imprint mask (template). The removal mask pattern creating unit 101 transmits the created removal mask pattern to the verifying unit 15Y and the normal mask pattern creating unit 102.

The normal mask pattern creating unit 102 extracts a design pattern to be formed using a process (optical lithography, imprint lithography, or the like) other than the DSA process based on the design pattern, the unnecessary area, and the DSA pattern as a normal pattern. The normal pattern includes a design pattern of an unnecessary area in which the unnecessary DSA pattern is removed among the design patterns. Moreover, the normal pattern includes a design pattern which is difficult to be formed by the DSA process in an area (necessary area which is an area outside the unnecessary area) in which the DSA patterns that are not removed are formed, among the design patterns. In other words, the normal pattern includes a design pattern in the unnecessary area and a design pattern excluding the DSA patterns from the design patterns outside the unnecessary area.

The normal mask pattern creating unit 102 creates a mask pattern (hereinafter, referred to as a normal mask pattern) for creating the normal pattern based on the normal pattern. In other words, the normal mask pattern creating unit 102 performs a mask data preparation (MDP) process on the normal pattern. The normal mask pattern creating unit 102 transmits the created normal mask pattern to the verifying unit 15Y.

The verifying unit 15Y verifies the removal mask pattern and the normal mask pattern in addition to the process performed by the verifying unit 15X described in the first embodiment. The verifying unit 15Y verifies whether an on-substrate pattern can be formed at a desired position when the on-substrate pattern is formed using the normal mask pattern based on the design pattern, the normal mask pattern, the unnecessary area, and the DSA pattern. The position at which the on-substrate pattern is formed when the normal mask pattern is used includes the positions in the unnecessary area where the design patterns are disposed and the positions in the necessary area where the design patterns are disposed and the DSA patterns are not formed.

Moreover, the verifying unit 15Y verifies whether the dimension of the normal mask pattern falls within the tolerance range from a target dimension based on the design pattern and the normal mask pattern. Specifically, the verifying unit 15Y verifies whether when the on-substrate pattern is formed using the normal mask pattern, the dimension of the on-substrate pattern will fall within the allowable range defined based on the design pattern. In other words, it is verified whether the on-substrate pattern formed using the normal mask pattern will be a pattern having approximately the same dimension as that of the design pattern. Moreover, the verifying unit 15Y verifies whether a process margin when forming the normal mask pattern falls within an allowable range.

Moreover, the verifying unit 15Y verifies whether the DSA pattern in the unnecessary area can be removed by lithography using the removal mask pattern based on the design pattern, the removal mask pattern, and the unnecessary area. Further, the verifying unit 15Y verifies whether a process margin when forming the removal mask pattern falls within an allowable range.

The verifying unit 15Y may verify the guide mask pattern. In this case, the verifying unit 15Y verifies whether the guide pattern can be formed at a desired position when the on-substrate pattern is formed by lithography using the guide mask pattern based on the guide pattern and the guide mask pattern. Moreover, the verifying unit 15Y verifies whether a process margin when forming the guide mask pattern falls within an allowable range.

When the verification result of the removal mask pattern is failure, the verifying unit 15Y notifies the removal mask pattern creating unit 101 of the pattern position corresponding to failure. Moreover, when the verification result of the normal mask pattern is failure, the verifying unit 15Y notifies the normal mask pattern creating unit 102 of the pattern position corresponding to failure. Further, when the verification result of the guide mask pattern is failure, the verifying unit 15Y notifies the guide pattern creating unit 13 of the pattern position corresponding to failure.

Moreover, when the verification result of the removal mask pattern is success, the verifying unit 15Y transmits the removal mask pattern to the output unit 17. Further, when the verification result of the normal mask pattern is success, the verifying unit 15Y transmits the normal mask pattern to the output unit 17. The output unit 17 outputs the removal mask pattern, the normal mask pattern, and the guide mask pattern to an external apparatus or the like.

Figure 15:
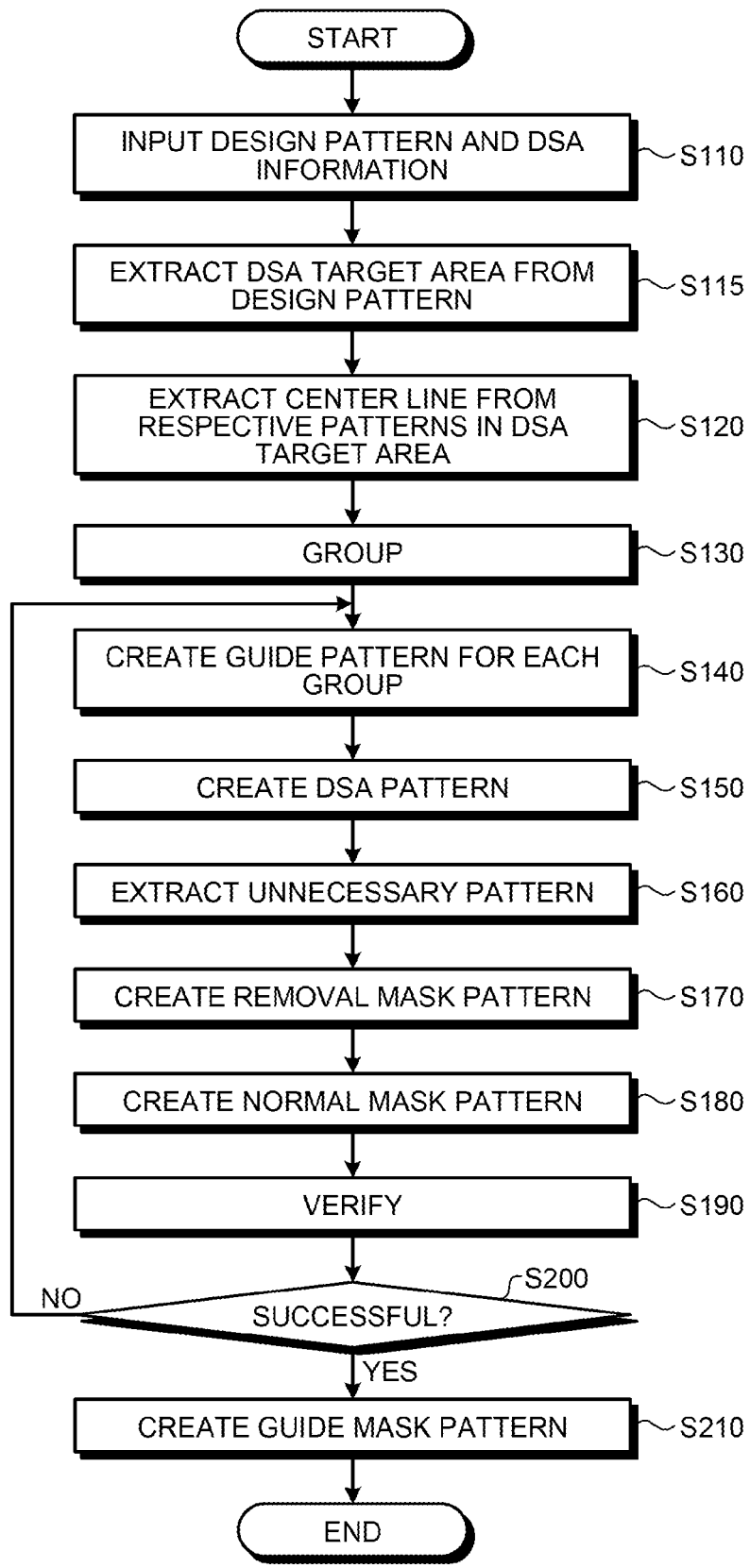
FIG. 15 is a flowchart illustrating the flow of a guide mask pattern creation process according to the second embodiment.

Next, the flow of a guide mask pattern creating process will be explained. FIG. 15 is a flowchart illustrating the flow of a guide mask pattern creating process according to the second embodiment. Among the processes illustrated in FIG. 15, description of the same processes as those of FIG. 5 will not be provided.

The mask pattern creating apparatus 2 creates DSA patterns in the same processing flow as the mask pattern creating apparatus 1. That is, steps S110 to S150 in FIG. 15 correspond to steps S10 to S50 described in FIG. 5.

After the DSA patterns are created, the mask pattern creating apparatus 2 transmits the DSA patterns predicted by the DSA pattern predicting unit 14 to the verifying unit 15Y and the removal mask pattern creating unit 101.

The removal mask pattern creating unit 101 extracts DSA patterns (unnecessary patterns) which are formed at the unnecessary positions among the DSA patterns based on the design pattern and the DSA pattern (step S160). The removal mask pattern creating unit 101 sends the unnecessary areas in which the extracted DSA patterns are disposed to the normal mask pattern creating unit 102.

Moreover, the removal mask pattern creating unit 101 creates removal mask patterns based on the unnecessary areas (step S170). The removal mask pattern creating unit 101 transmits the created removal mask patterns to the verifying unit 15Y and the normal mask pattern creating unit 102.

The normal mask pattern creating unit 102 extracts normal patterns which are formed using a process other than the DSA process from the design patterns based on the design pattern, the unnecessary area, and the DSA pattern.

Moreover, the normal mask pattern creating unit 102 creates normal mask patterns based on the normal patterns (step S180). The normal mask pattern creating unit 102 transmits the created normal mask patterns to the verifying unit 15Y.

The verifying unit 15Y verifies the DSA patterns, the removal mask patterns, and the normal mask patterns (step S190). Specifically, the verifying unit 15Y verifies whether the dimension of a DSA pattern in the DSA target area falls within the tolerance range from the target dimension among the predicted DSA patterns. When the dimension of the DSA pattern does not fall within the tolerance range (No in step S200), the verifying unit 15Y extracts out-of-tolerance areas. Moreover, the verifying unit 15Y transmits the extracted out-of-tolerance areas to the guide pattern creating unit 13.

When the out-of-tolerance areas are transmitted from the verifying unit 15Y, the guide pattern creating unit 13 re-creates guide patterns for the design patterns included in the out-of-tolerance areas based on the DSA information (step S140). The guide pattern creating unit 13 transmits the re-created guide patterns to the DSA pattern predicting unit 14, and the DSA pattern predicting unit 14 re-predicts DSA patterns (step S150).

Moreover, the removal mask pattern creating unit 101 re-extracts unnecessary patterns based on the design pattern and the DSA pattern (step S160), and re-creates the removal mask patterns based on the unnecessary patterns (step S170).

Moreover, the normal mask pattern creating unit 102 extracts normal patterns from the design patterns based on the design patterns, the unnecessary areas, and the DSA patterns and re-creates the normal mask patterns based on the normal patterns (step S130).

The verifying unit 15Y verifies whether the dimension of each of the predicted DSA patterns falls within the tolerance range from the target dimension. In this way, the guide pattern creating unit 13, the DSA pattern predicting unit 14, the removal mask pattern creating unit 101, the normal mask pattern creating unit 102, and the verifying unit 15Y repeatedly perform the processes of steps S140 to S200 until the dimension of all of the DSA patterns falls within the tolerance range.

When the verification result of the removal mask pattern is failure, the verifying unit 15Y notifies the removal mask pattern creating unit 101 of the pattern position corresponding to failure. In this case, the removal mask pattern creating unit 101 re-creates the removal mask patterns so that the removal mask patterns are successfully verified.

Moreover, when the verification result of the normal mask pattern is failure, the verifying unit 15Y notifies the normal mask pattern creating unit 102 of the pattern position corresponding to failure. In this case, the normal mask pattern creating unit 102 re-creates the normal mask patterns so that the normal mask patterns are successfully verified.

When the dimension of all of the DSA patterns falls within the tolerance range from the target dimension (Yes in step S200), the verifying unit 15Y transmits a notification of success to the guide pattern creating unit 13. Upon receiving the notification of success from the verifying unit 15Y, the guide pattern creating unit 13 transmits the created or re-created guide patterns to the guide mask pattern creating unit 16. The guide mask pattern creating unit 16 creates a guide mask pattern corresponding to the guide patterns sent from the guide pattern creating unit 13 (step S210).

Moreover, when the verification result of the guide mask pattern is failure, the verifying unit 15Y notifies the guide mask pattern creating unit 16 of the pattern position corresponding to failure. In this case, the guide mask pattern creating unit 16 re-creates the guide mask patterns so that the guide mask patterns are successfully verified.

After all of the DSA patterns is successfully verified, the removal mask patterns or the normal mask patterns may be created. Moreover, after the guide mask patterns are successfully verified, the removal mask patterns and the normal mask patterns may be created.

Next, an example of an on-substrate pattern formed using the mask pattern creation method according to the present embodiment will be explained. FIGS. 16A to 16F are diagrams for explaining the mask pattern creation method according to the second embodiment.

Figure 16A:
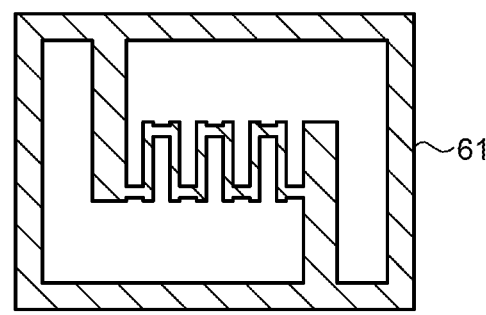
FIGS. 16A to 16F are diagrams for explaining a mask pattern creation method according to the second embodiment.

FIG. 16A illustrates a design pattern 61 of an on-substrate pattern formed on a substrate. When guide mask patterns for forming guide patterns are created, the design pattern 61 is input to the mask pattern creating apparatus 2.

Figure 16B:
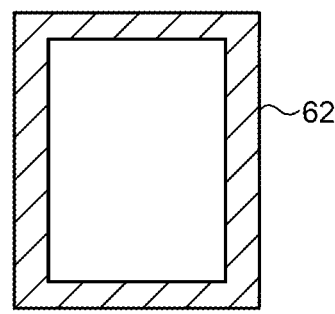

The mask pattern creating apparatus 2 extracts a DSA target area from the design pattern 61 and creates a guide pattern 62 that can form the DSA pattern corresponding to the design pattern 61 disposed in the DSA target area. FIG. 16B illustrates a case where the guide pattern 62 having a ring-shape.

Figure 16C:
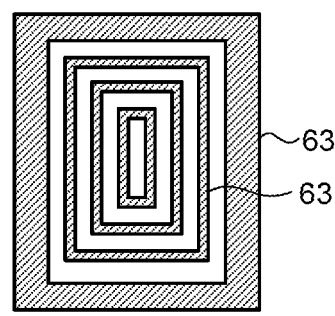

The mask pattern creating apparatus 2 predicts DSA patterns 63 to be formed using the guide pattern 62. FIG. 16C illustrates a case where the ring-shaped DSA patterns 63 are formed on the ring-shaped guide pattern 62 and in the inner side thereof. In the inner side of the guide pattern 62, DSA patterns 63 having a constant pattern width are formed at a constant space width.

The mask pattern creating apparatus 2 verifies whether the dimension of each of the predicted DSA patterns 63 falls within an allowable range. Moreover, the mask pattern creating apparatus 2 verifies whether a process margin when forming the predicted DSA patterns 63 falls within an allowable range. When the process margin does not fall within the allowable range, the guide pattern 62 is corrected until the dimension thereof falls within the allowable range. If the dimension does not fall within the allowable range even when the guide pattern 62 is corrected in a predetermined number of times, the guide pattern 62 may be excluded from the DSA target area.

Figure 16D:
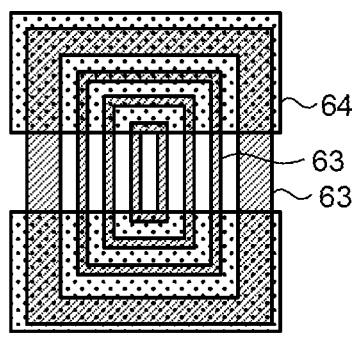

When the dimension of the DSA pattern 63 falls within the allowable range by the correction performed as necessary, the mask pattern creating apparatus 2 creates a guide mask pattern for the guide pattern 62 corresponding to the DSA pattern 63. Moreover, an unnecessary area is extracted for the DSA pattern 63 of which the dimension falls within the allowable range. Moreover, as illustrated in FIG. 16D, the mask pattern creating apparatus 2 extracts an unnecessary area in which the unnecessary DSA pattern 63 is removed and creates a removal mask pattern 64 corresponding to the unnecessary area.

Figure 16E:
Figure 16F:
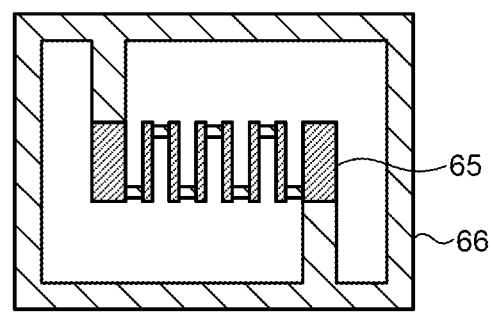

After that, as illustrated in FIG. 16E, the mask pattern creating apparatus 2 extracts a DSA pattern in which unnecessary areas are removed using the removal mask pattern 64 as a DSA pattern 65. Moreover, the mask pattern creating apparatus 2 compares the DSA pattern 65 with the design pattern 61 and extracts a pattern corresponding to a subtraction of the DSA pattern 65 from the design pattern 61 as a normal pattern 66 as illustrated in FIG. 16F. A pattern corresponding to an addition of the normal pattern 66 and the DSA pattern 65 becomes the design pattern 61. The mask pattern creating apparatus 2 creates a normal mask pattern for forming the normal pattern 66 on the substrate.

After that, a circuit pattern of a semiconductor device is formed on the substrate using the guide mask pattern, the removal mask pattern, and the normal mask pattern. Specifically, a first mask is produced using the guide mask pattern, a second mask is produced using the removal mask pattern, and a third mask is produced using the normal mask pattern.

Moreover, a hydrophilic film in which the guide pattern is patterned is deposited on a substrate, and a resist is applied to the DSA molecules 20. After that, exposure and imprinting are performed using the first mask, whereby a resist pattern corresponding to the guide mask pattern is formed on the substrate. Moreover, the substrate is etched from the resist pattern, whereby a guide pattern formed of the hydrophilic film is formed.

DSA molecules are applied to the guide pattern, whereby a DSA pattern is formed on the substrate. After that, unnecessary DSA patterns are removed using the second mask. Specifically, a resist is applied to the DSA pattern, and exposure and imprinting are performed using the second mask, whereby a resist pattern to resist pattern covering unnecessary areas) corresponding to the removal mask pattern is formed on the substrate. Moreover, the substrate is etched from the resist pattern, whereby unnecessary DSA patterns are removed.

After that, an on-substrate pattern corresponding to the normal pattern is formed on the substrate using the third mask. Specifically, a resist is applied to the DSA pattern, and exposure and imprinting are performed using the third mask, whereby a resist pattern corresponding to the normal mask pattern is formed on the substrate. Moreover, the substrate is etched from the resist pattern, whereby the on-substrate pattern corresponding to the normal pattern is formed on the substrate. With the on-substrate pattern and the DSA pattern corresponding to the normal pattern, a desired circuit pattern or the like is formed on the substrate.

The forming of the on-substrate pattern using the DSA pattern is performed for each layer of the wafer process. Thus, the creation of the guide mask pattern, the creation of the removal mask pattern, the creation of the normal mask pattern, the production of the first to third masks, the forming of the guide pattern using the first mask, the creation of the DSA pattern, the removal of the unnecessary DSA pattern using the second mask, and the forming of the on-substrate pattern corresponding to the normal pattern using the third mask are repeatedly performed for each layer.

Next, a hardware configuration of the mask pattern creating apparatuses 1 and 2 will be explained. Since the mask pattern creating apparatuses 1 and 2 have the same hardware configuration, in this example, the hardware configuration of the mask pattern creating apparatus 2 will be explained.

Figure 17:
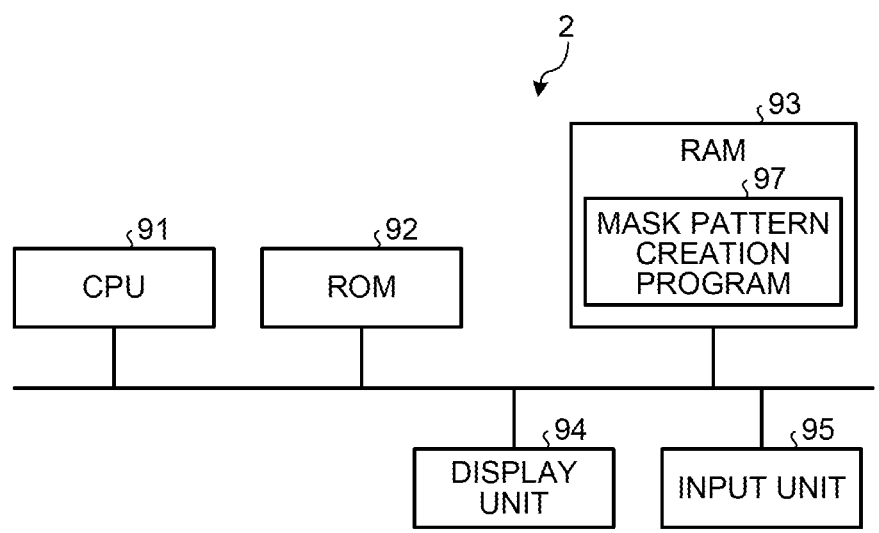
FIG. 17 is a diagram illustrating a hardware configuration of the mask pattern creating apparatus.

FIG. 17 is a diagram illustrating the hardware configuration of the mask pattern creating apparatus 2. The mask pattern creating apparatus 2 includes a central processing unit (CPU) 91, a read only memory (ROM) 92, a random access memory (RAM) 93, a display unit 94, and an input unit 95. In the mask pattern creating apparatus 2, the CPU 91, the ROM 92, the RAM 93, the display unit 94, and the input unit 95 are connected via a bus line.

The CPU 91 creates mask patterns using a mask pattern creation program 97 which is a computer program. The display unit 94 is a display device such as a liquid crystal monitor and displays design patterns, DSA information, DSA target areas, guide patterns, DSA patterns, verification results, unnecessary areas, guide mask patterns, removal mask patterns, normal mask patterns, and the like in accordance with an instruction from the CPU 91. The input unit 95 includes a mouse and a keyboard and inputs instruction information (parameters necessary for creation of mask patterns or the like) input from a user. The instruction information input to the input unit 95 is transmitted to the CPU 91.

The mask pattern creation program 97 is stored in the ROM 92 and is loaded into the RAM 93 via the bus line. FIG. 17 illustrates a state where the mask pattern creation program 97 is loaded into the RAM 93.

The CPU 91 executes the mask pattern creation program 97 loaded into the RAM 93. Specifically, in the mask pattern creating apparatus 2, the CPU 91 reads the mask pattern creation program 97 from the ROM 92 in accordance with an instruction of the user from the input unit 95, develops the mask pattern creation program 97 into a program storage area in the RAM 93, and executes various processes. The CPU 91 temporarily stores various types of data generated when performing the processes in a data storage area formed in the RAM 93.

The mask pattern creation program 97 executed by the mask pattern creating apparatus 2 includes modules including the DSA target area extracting unit 12, the guide pattern creating unit 13, the DSA pattern predicting unit 14, the verifying unit 15Y, the guide mask pattern creating unit 16, the removal mask pattern creating unit 101, and the normal mask pattern creating unit 102, and these modules are loaded onto a main storage device and are generated on the main storage device.

The mask pattern creation program 97 executed by the mask pattern creating apparatus 1 described in the first embodiment includes modules including the DSA target area extracting unit 12, the guide pattern creating unit 13, the DSA pattern predicting unit 14, the verifying unit 15X, and the guide mask pattern creating unit 16.

As above described, according to the second embodiment, the removal mask pattern is created based on the DSA pattern and the design pattern. Thus, it is possible to easily create the removal mask pattern used in the DSA process.

Moreover, since the normal mask pattern is created based on the design pattern, the unnecessary area, and the DSA pattern, it is possible to easily create the normal mask pattern used in the DSA process.

Further, the removal mask pattern, the guide mask pattern, and the normal mask pattern are verified, and when the verification result of failure is obtained, the removal mask pattern, the guide mask pattern, and the normal mask pattern are re-created so that the verification result of success is to be obtained. Thus, it is possible to create the removal mask pattern, the guide mask pattern, and the normal mask pattern accurately.

As above described, according to the first and second embodiments, it is possible to easily create mask patterns used in the DSA process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask pattern creation method comprising:
extracting, from a design pattern area of a design pattern, a DSA pattern formation area in which DSA pattern is formed by using a DSA process, the DSA process being a process in which a DSA material is directed self-assembled, the extracting of the DSA pattern formation area being based on the design pattern of an on-substrate pattern to be formed on a substrate and information on the DSA material that forms patterns using directed self-assembly;
creating a guide pattern that causes the DSA pattern to be formed in the DSA pattern formation area based on the design pattern, the information on the DSA material, the DSA pattern formation area, and a design constraint when forming the guide pattern; and
creating a mask pattern of the guide pattern using the guide pattern.

2. The mask pattern creation method according to claim 1, wherein
when creating the guide pattern,
a center-to-center distance between adjacent design patterns is extracted from design patterns in the DSA pattern formation area,
a center-to-center distance which is smaller than a prescribed value is extracted as an allowable distance,
design patterns adjacent within the allowable distance are set to belong to one group, whereby design patterns formed in the DSA pattern formation are grouped, and
the guide pattern is formed for each of the grouped design patterns.

3. The mask pattern creation method according to claim 1, further comprising:
predicting by simulation DSA patterns to be formed from the guide pattern and verifying whether the dimension of each of the predicted DSA patterns falls within an allowable range; and
when the dimension of the predicted DSA pattern is out of the allowable range, correcting the guide pattern so that the dimension of the DSA pattern falls within the allowable range.

4. The mask pattern creation method according to claim 1, further comprising:
creating a mask pattern used when removing an unnecessary DSA pattern which does not correspond to the design pattern among the DSA patterns based on the DSA patterns and the design patterns.

5. The mask pattern creation method according to claim 1, further comprising:
creating a mask pattern used when forming a design pattern which is not formed on the substrate by the DSA patterns among the design patterns based on the DSA patterns and the design patterns.

6. The mask pattern creation method according to claim 1, wherein
the information on the DSA material includes information on the length of DSA molecules that constitute the DSA material.

7. The mask pattern creation method according to claim 1, wherein
the information on the DSA material includes information on the type of DSA molecules that constitute the DSA material.

8. A non-transitory computer readable recording medium storing a mask pattern creation program for causing a computer to create mask patterns, the mask pattern creation program causing the computer to execute:
extracting, from a design pattern area of a design pattern, a DSA pattern formation area in which a DSA pattern is formed by using a DSA process, the DSA process being a process in which a DSA material is directed self-assembled, the extracting of the DSA pattern formation area being based on the design pattern of an on-substrate pattern to be formed on a substrate and information on the DSA material that forms patterns using directed self-assembly;
creating a guide pattern that causes the DSA pattern to be formed in the DSA pattern formation area based on the design pattern, the information on the DSA material, the DSA pattern formation area, and a design constraint when forming the guide pattern; and
creating a mask pattern of the guide pattern using the guide pattern.

9. The non-transitory computer readable recording medium according to claim 8, wherein when creating the guide pattern, a center-to-center distance between adjacent design patterns is extracted from design patterns in the DSA pattern formation area, a center-to-center distance which is smaller than a prescribed value is extracted as an allowable distance, design patterns adjacent within the allowable distance are set to belong to one group, whereby design patterns formed in the DSA pattern formation are grouped, and the guide pattern is formed for each of the grouped design patterns.

10. The non-transitory computer readable recording medium according to claim 8, further comprising:

predicting by simulation DSA patterns to be formed from the guide pattern and verifying whether the dimension of each of the predicted DSA patterns falls within an allowable range; and when the dimension of the predicted DSA pattern is out of the allowable range, correcting the guide pattern so that the dimension of the DSA pattern falls within the allowable range.

11. The non-transitory computer readable recording medium according to claim 8, further comprising:

creating a mask pattern used when removing an unnecessary DSA pattern which does not correspond to the design pattern among the DSA patterns based on the DSA patterns and the design patterns.

12. The non-transitory computer readable recording medium according to claim 8, further comprising:

creating a mask pattern used when forming a design pattern which is not formed on the substrate by the DSA patterns among the design patterns based on the DSA patterns and the design patterns.

13. The non-transitory computer readable medium according to claim 8, wherein the information on the DSA material includes information on the length of DSA molecules that constitute the DSA material.

14. The non-transitory computer readable recording medium according to claim 8, wherein the information on the DSA material includes information on the type of DSA molecules that constitute the DSA material.

\* \* \* \* \*